United States Patent
Chen et al.

(10) Patent No.: US 10,035,307 B2
(45) Date of Patent: Jul. 31, 2018

(54) METHOD AND APPARATUS OF THREE-DIMENSIONAL PRINTING AND ELECTRONIC APPARATUS

(71) Applicants: XYZprinting, Inc., New Taipei (TW); Kinpo Electronics, Inc., New Taipei (TW); Cal-Comp Electronics & Communications Company Limited, New Taipei (TW)

(72) Inventors: Peng-Yang Chen, New Taipei (TW); Wen-Ten Lin, New Taipei (TW)

(73) Assignees: XYZprinting, Inc., New Taipei (TW); Kinpo Electronics, Inc., New Taipei (TW); Cal-Comp Electronics & Communications Company Limited, New Taipei (TW)

( * ) Notice: Subject to any disclaimer, the term of this patent is extended or adjusted under 35 U.S.C. 154(b) by 840 days.

(21) Appl. No.: 14/277,067

(22) Filed: May 14, 2014

(65) Prior Publication Data
US 2015/0258736 A1 Sep. 17, 2015

(30) Foreign Application Priority Data
Mar. 17, 2014 (TW) .............................. 103109897 A

(51) Int. Cl.
*B29C 64/386* (2017.01)
*B29C 67/00* (2017.01)
(Continued)

(52) U.S. Cl.
CPC ........ *B29C 67/0088* (2013.01); *B29C 64/135* (2017.08); *B29C 64/386* (2017.08);
(Continued)

(58) Field of Classification Search
CPC .................................................. B29C 67/0088
(Continued)

(56) References Cited

U.S. PATENT DOCUMENTS

| 4,575,330 A * | 3/1986 | Hull | .................... B29C 67/0062 156/58 |
| 5,182,056 A * | 1/1993 | Spence | ............... B29C 67/0066 118/423 |

(Continued)

OTHER PUBLICATIONS

Cao et al. "Direct Slicing from AutoCAD Solid Models for Rapid Prototyping" Jul. 2003, The International Journal of Advanced Manufacturing Technology, vol. 21, Issue 10, pp. 739-742.*

(Continued)

*Primary Examiner* — James D. Rutten
(74) *Attorney, Agent, or Firm* — JCIPRNET

(57) ABSTRACT

A method and an apparatus of three-dimensional (3D) printing and an electronic apparatus are provided. The 3D printing method is adapted for printing a 3D object and includes the following. A plurality of layer objects of a 3D model are obtained, and a plurality of two-dimensional images, which correspond to a slice plane, of each of the layer objects are generated. The layer objects include a first layer object and a second layer object. When a comparison relationship between a two-dimensional image of the first layer object and a two-dimensional image of the second layer object matches a stack condition, the first layer object and the second layer object are stacked to generate thickness stack information of a stack object. A printing mechanism is initiated according to the thickness stack information so as to print a 3D object associated with the 3D model.

18 Claims, 7 Drawing Sheets

(51) Int. Cl.
  *B33Y 10/00* (2015.01)
  *B33Y 50/02* (2015.01)
  *B29C 64/135* (2017.01)
  *G06F 17/50* (2006.01)

(52) U.S. Cl.
  CPC ............... *B33Y 10/00* (2014.12); *B33Y 50/02* (2014.12); *G06F 17/50* (2013.01)

(58) Field of Classification Search
  USPC .......................................................... 700/98
  See application file for complete search history.

(56) References Cited

U.S. PATENT DOCUMENTS

| | | | | |
|---|---|---|---|---|
| 5,637,175 | A * | 6/1997 | Feygin ...................... | B22C 9/00 156/256 |
| 6,366,825 | B1 * | 4/2002 | Smalley .............. | B29C 67/0092 264/401 |
| 2010/0298961 | A1 * | 11/2010 | Frisken .............. | G05B 19/4069 700/103 |
| 2012/0195994 | A1 * | 8/2012 | El-Siblani ............. | B29C 67/007 425/174.4 |

OTHER PUBLICATIONS

Ma et al. "NURBS-based adaptive slicing for efficient rapid prototyping" Nov. 2004, Elsevier, Computer-Aided Design, vol. 36, Issue 13, pp. 1309-1325 (Year: 2004).*

* cited by examiner

METHOD AND APPARATUS OF THREE-DIMENSIONAL PRINTING AND ELECTRONIC APPARATUS

CROSS-REFERENCE TO RELATED APPLICATION

This application claims the priority benefit of Taiwan application serial no. 103109897, filed on Mar. 17, 2014. The entirety of the above-mentioned patent application is hereby incorporated by reference herein and made a part of this specification.

BACKGROUND

Technical Field

The technical field relates to a printing method and more particularly relates to a three-dimensional printing method.

Description of Related Art

As the technology advanced in recent years, many methods that utilize additive manufacturing technology (e.g. layer-by-layer model construction) to build three-dimensional (3D) physical models have been proposed. Generally speaking, the additive manufacturing technology is to transfer data of the design of a 3D model, which is constructed by software, such as computer aided design (CAD), to multiple thin (quasi-two-dimensional) cross-sectional layers that are stacked in sequence. In the meantime, many techniques for forming thin cross-sectional layers are also proposed. For example, a printing module of a printing apparatus is usually configured to move above a base along an XY plane according to spatial coordinates XYZ constructed according to the design data of the 3D model, so as to use a construction material to form shapes of the cross-sectional shapes correctly. Then, the deposited construction material may be cured naturally or by heating or light irradiation to form the desired cross-sectional layers. By moving the printing module along the Z axis layer by layer, multiple cross-sectional layers can be gradually stacked along the Z axis, and while the construction material is cured layer by layer, a 3D object is formed.

Take the technology that forms 3D objects by curing the construction material with a light source as an example, the printing module is configured to be immersed in a liquid molding material in a container, and a light source module is disposed to irradiate the liquid molding material that serves as the construction material on the XY plane, so as to cure and stack the liquid molding material on a movable platform of the printing module. Accordingly, by moving the movable platform of the printing module layer by layer along the Z axis, the liquid molding material can be gradually cured and stacked to form the 3D object. However, for the current 3D printing technology, how to improve 3D printing speed and quality is still an important issue.

SUMMARY

One of the exemplary embodiments provides a three-dimensional printing method, a three-dimensional printing apparatus, and an electronic apparatus for increasing a speed of three-dimensional printing.

One of exemplary embodiments provides a three-dimensional printing method adapted for printing a three-dimensional object. The three-dimensional printing method includes the following steps. A plurality of layer objects of a three-dimensional model are obtained, and a plurality of two-dimensional images, which correspond to a slice plane, of each of the layer objects are generated. The layer objects include a first layer object and a second layer object adjacent to each other. When a comparison relationship between the two-dimensional image of the first layer object and the two-dimensional image of the second layer object matches a stack condition, the first layer object and the second layer object are stacked to generate thickness stack information of a stack object. A printing mechanism is initiated according to the thickness stack information so as to print the three-dimensional object associated with the three-dimensional model.

One of exemplary embodiments provides a three-dimensional printing apparatus, including a processor. The processor obtains a plurality of layer objects of a three-dimensional model and generates a plurality of two-dimensional images, corresponding to a slice plane, of each of the layer objects. The layer objects include a first layer object and a second layer object adjacent to each other. When a comparison relationship between the two-dimensional image of the first layer object and the two-dimensional image of the second layer object matches a stack condition, the processor stacks the first layer object and the second layer object to generate thickness stack information of a stack object. The processor initiates a printing mechanism according to the thickness stack information so as to print a three-dimensional object of the three-dimensional model.

One of exemplary embodiments provides an electronic apparatus, including a processor. The processor obtains a plurality of layer objects of a three-dimensional model and generates a plurality of two-dimensional images, corresponding to a slice plane, of each of the layer objects. The layer objects include a first layer object and a second layer object adjacent to each other. When a comparison relationship between the two-dimensional image of the first layer object and the two-dimensional image of the second layer object matches a stack condition, the processor stacks the first layer object and the second layer object to generate thickness stack information of a stack object. The processor controls the three-dimensional printing apparatus to initiate a printing mechanism according to the thickness stack information, so as to print a three-dimensional object associated with the three-dimensional model.

Based on the above, in the embodiments of the disclosure, coverages of multiple layer objects of the object to be printed with respect to the XY plane are compared for stacking layer objects that match the stack condition, so as to generate the stack object having cumulative thickness. Accordingly, the three-dimensional printing apparatus adjusts the output intensity of the light source according to the cumulative thickness of the stack object and controls the irradiation pathway according to the combined control code file, so as to cure the irradiated liquid molding material to form the three-dimensional object on the movable platform. By cumulating the layers before printing, the three-dimensional printing apparatus reduces the times of moving the movable platform and effectively shortens the time for scanning of the light source, thereby improving the printing efficiency.

To make the aforementioned and other features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
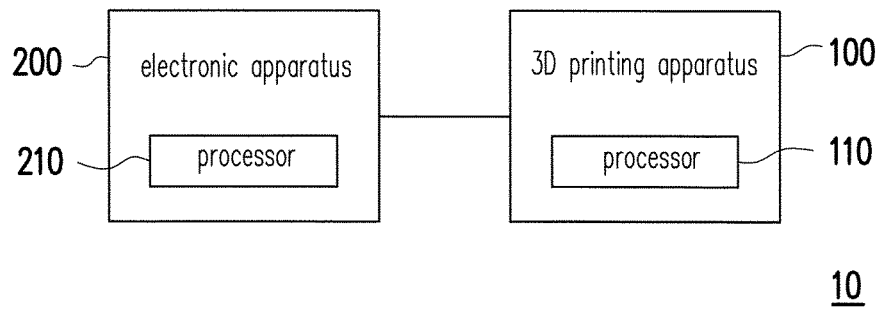
FIG. 1 is a block diagram illustrating a three-dimensional printing system according to an exemplary embodiment.

Exemplary embodiments of the disclosure are explained in detail below with reference to the drawings. In addition, wherever possible, identical or similar reference numerals stand for identical or similar elements/components in the drawings and embodiments.

FIG. 1 is a block diagram illustrating a three-dimensional printing system according to an exemplary embodiment. With reference to FIG. 1, a three-dimensional (3D) printing system 10 includes a three-dimensional (3D) printing apparatus 100 and an electronic apparatus 200. The 3D printing apparatus 100 is coupled to the electronic apparatus 200 and includes a processor 110. Likewise, the electronic apparatus 200 includes a processor 210.

The electronic apparatus 200 is a device having an operation function, such as a computing device, e.g. laptop computer, tablet computer, or desktop computer, etc., for example. The disclosure is not intended to limit the types of the electronic apparatus 200. In this embodiment, the processor 210 of the electronic apparatus 200 is capable of editing and processing a 3D model of a 3D object and transmitting related 3D model information to the 3D printing apparatus 100, for the 3D printing apparatus 100 to print out the 3D object according to the 3D model information. More specifically, the 3D model may be a digital 3D image file that is constructed by the electronic apparatus 200 by means of computer-aided design (CAD) or animation modeling software, for example.

The 3D printing apparatus 100 is adapted for printing a 3D object according to the 3D model information transmitted by the electronic apparatus 200. To be more specific, the processor 110 controls each component of the 3D printing apparatus 100 according to the 3D model information, so as to reiteratively print a molding material on a platform until the whole 3D object is formed.

The processors 110 and 210 may be a central processing unit (CPU), a programmable microprocessor for general or special use, a digital signal processor (DSP), a programmable controller, an application specific integrated circuit (ASIC), a programmable logic device (PLD), other similar devices, or a combination of these devices, for example. Nevertheless, the disclosure is not intended to limit the types of the processors 110 and 210.

It is noted that coding and calculation are further performed on the 3D model to generate the 3D model information that the 3D printing apparatus 100 reads to execute the printing function. Specifically, the processor 210 of the electronic apparatus 200 first performs a slicing process on the 3D model to generate a plurality of layer objects of the 3D model. Generally, the processor 210 slices the 3D model by slice planes with a fixed interval therebetween, so as to obtain section profiles of the layer objects. The interval by which the 3D model is sliced may be deemed as the thickness of the layer object. The smaller the thickness of the layer object is, the higher the formation precision of the 3D object is, but the formation time is also longer.

Moreover, the processor 210 generates a control code file corresponding to the section profile of each layer object. The control code file is the 3D model information that the 3D printing apparatus 100 reads to execute the printing function. In other words, the processor 110 of the 3D printing apparatus 100 controls the components in the 3D printing apparatus 100 according to the control code files, so as to form the layer objects on the platform layer by layer. In an embodiment, the control code file is a G code file, for example.

Figure 2:
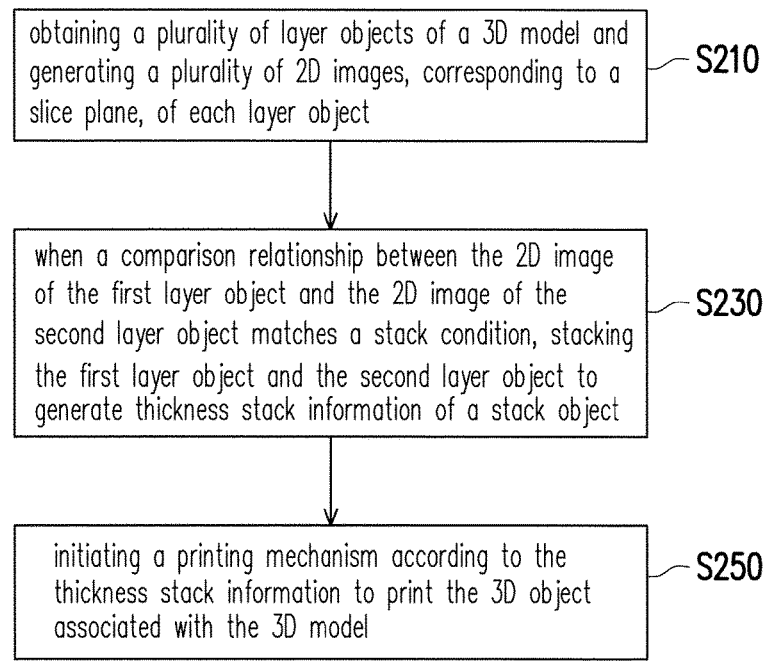
FIG. 2 is a flowchart illustrating a three-dimensional printing method according to an exemplary embodiment.

FIG. 2 is a flowchart illustrating a three-dimensional printing method according to an exemplary embodiment. The method of this embodiment is adapted for the 3D printing system 10 of FIG. 1. Steps of the 3D printing method of this embodiment are explained in detail hereinafter with reference to the components in the 3D printing system 10.

First, in Step S210, the processor 210 obtains a plurality of layer objects of a 3D model and generates a plurality of two-dimensional (2D) images, corresponding to a slice plane, of each of the layer objects. A section profile of each layer object can be clearly seen from the 2D images. The layer objects at least include a first layer object and a second layer object that are adjacent to each other. In other words, the first layer object and the second layer object may be deemed as any two adjacent layer objects among the layer objects.

In Step S230, when a comparison relationship between the 2D image of the first layer object and the 2D image of the second layer object matches a stack condition, the processor 210 stacks the first layer object and the second layer object to generate thickness stack information of a stack object. That is to say, the processor 210 is capable of comparing the 2D image of the first layer object with the 2D image of the second layer object by various image comparison methods. If the comparison relationship between the 2D image of the first layer object and the 2D image of the second layer object matches the stack condition, the first layer object and the second layer object are stacked to form the stack object. In addition, the processor 110 generates the thickness stack information of the stack object according to thickness information and control code files of the first layer object and the second layer object, for example.

Then, in Step S250, the processor 210 initiates a printing mechanism according to the thickness stack information, so as to print the 3D object associated with the 3D model. More specifically, the processor 210 transmits the thickness stack information of the stack object to the 3D printing apparatus 100 for the 3D printing apparatus 100 to print out the 3D object associated with the 3D model according to the thickness stack information.

It is noted that, in an embodiment, the processor 210 compares the layer objects layer by layer in a direction and continues stacking layer objects that match the stack condition according to a comparison result to generate at least one stack object. The thickness of the stack object is determined by the times of stacking. That is to say, through performing the above comparison and stacking processes in sequence, the 3D model having multiple layer objects is transferred to the 3D model having at least one stack object. Therefore, the slicing of the 3D model may be dynamically adjusted according to the method of the exemplary embodiment, and the 3D printing apparatus 100 can print the 3D object according to the combined thickness corresponding to the stack objects and the combined control code files.

It is noted that, in the above embodiment, the processor 210 of the electronic apparatus 200 executes Steps S210 to S250, for example. However, in another embodiment, Steps S210 to S250 may be executed by the processor 110 of the 3D printing apparatus 100. Specifically, the processor 110 may obtain information related to the multiple layer objects from the electronic apparatus 200 to generate a plurality of 2D images, corresponding to a slice plane, of each of the layer objects. Similarly, after the processor 110 generates the thickness stack information of the stack object, the processor 110 may control other printing components of the 3D printing apparatus 100 to execute the printing function.

Figure 3:
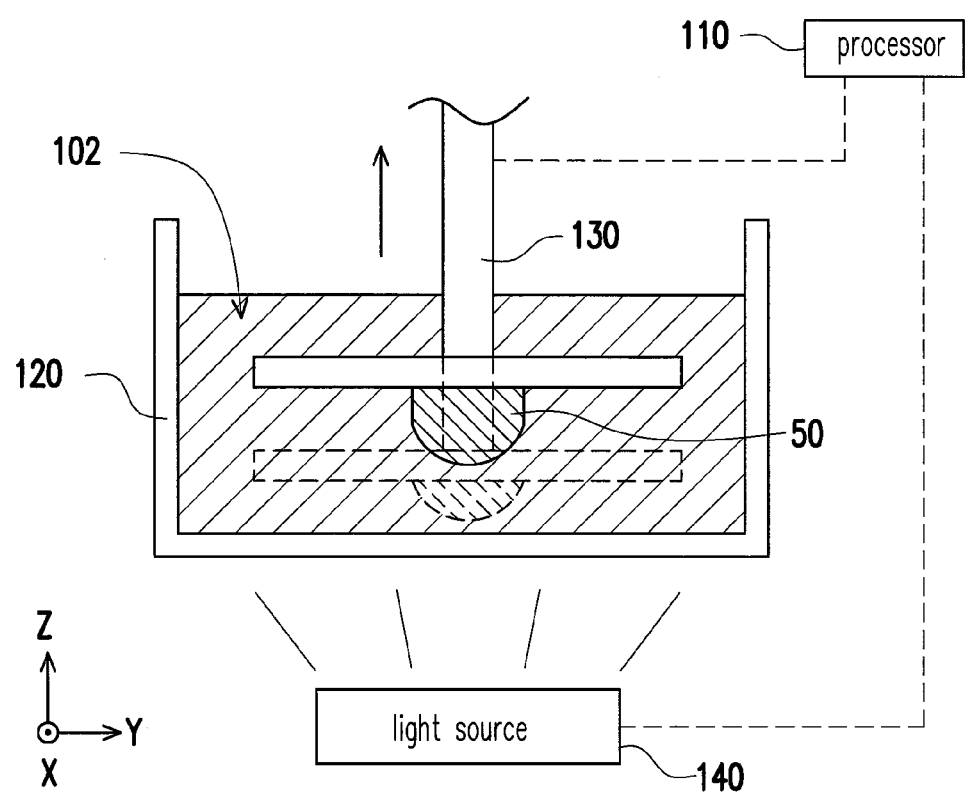
FIG. 3 is a partial schematic diagram illustrating a three-dimensional printing apparatus according to an exemplary embodiment.

In order to clearly illustrate and explain the operation principle of the 3D printing method of the exemplary embodiments, stereolithography (SLA) is described below as an example. FIG. 3 is a partial schematic diagram illustrating a three-dimensional printing apparatus according to an exemplary embodiment. Referring to FIG. 3, the 3D printing apparatus 100 includes the processor 110, a container 120, a movable platform 130, and a light source 140. Here a Cartesian coordinate system is used to describe the components and their motions. The container 120 is used to contain a liquid molding material 102, and a portion of the movable platform 130 is immersed in the liquid molding material 102. The light source 140 is adapted to emit light to the liquid molding material 102.

The processor 110 electrically connects the light source 140 and the movable platform 130 for moving the portion of the movable platform 130 above the container 120 along a Z axis. In this embodiment, a photosensitive resin or other suitable light-curable material is used as the liquid molding material 102. Thus, after being irradiated by the light of the light source 140, the liquid molding material 102 is cured.

It is worth mentioning that, in an embodiment, the stack condition is set to determine whether a coverage of the 2D image of the second layer object is larger than or equal to a coverage of the 2D image of the first layer object. In other words, when the coverage of the 2D image of the second layer object is larger than or equal to the coverage of the 2D image of the first layer object, at least one combined thickness and at least one combined control code file are generated by stacking the first layer object and the second layer object. Exemplary embodiments of different stack conditions and stacking methods are given below to explain the disclosure.

Figure 4:
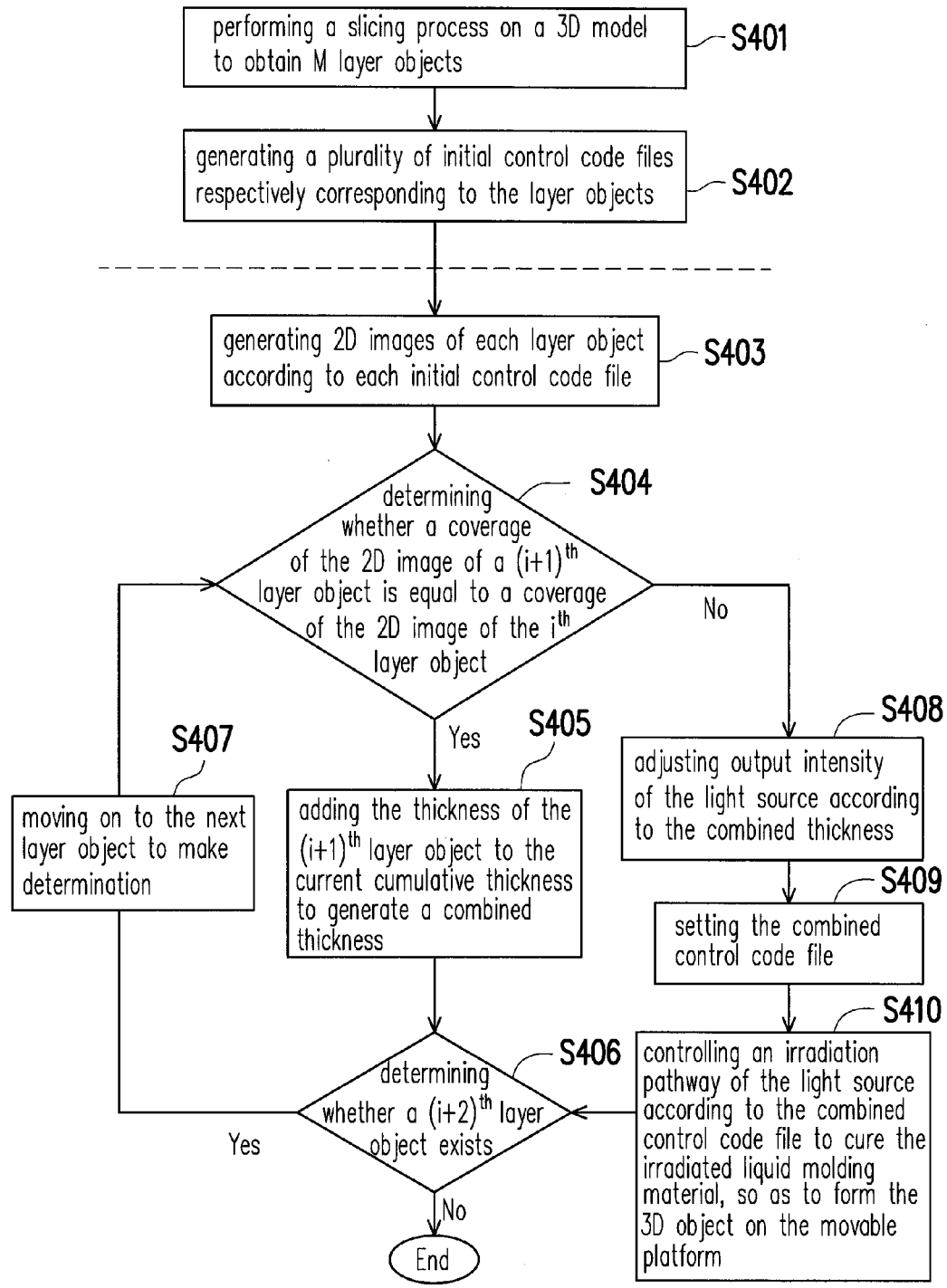
FIG. 4 is a flowchart illustrating a three-dimensional printing method according to an exemplary embodiment.

FIG. 4 is a flowchart illustrating a three-dimensional printing method according to an exemplary embodiment. The method of this embodiment is adapted for the 3D printing system of FIG. 1 and the 3D printing apparatus of FIG. 3. Steps of the 3D printing method of this embodiment are explained in detail hereinafter with reference to the components of the 3D printing system 10 and the 3D printing apparatus 100.

First, the processor 210 performs a slicing process on a 3D model to obtain M layer objects (Step S401), wherein M is an integer greater than 1. Next, the processor 210 generates a plurality of initial control code files respectively corresponding to the layer objects (Step S402). In other words, the processor 210 generates the initial control code file of an $i^{th}$ layer object in sequence, wherein i is an integer greater than 0 and smaller than or equal to M.

For example, when M is equal to 3, it indicates that the processor 210 slices the 3D model into three layer objects, which are a first layer object, a second layer object, and a third layer object. Then, according to section profile information of each layer object, the processor 210 respectively generates the initial control code file of the first layer object, the initial control code file of the second layer object, and the initial control code file of the third layer object.

Thereafter, the electronic apparatus 200 outputs the initial control code file of each layer object, e.g. the G code file of each layer object, to the 3D printing apparatus 100. Accordingly, the processor 110 generates 2D images of each layer object according to the initial control code files (Step S403). Simply put, the processor 110 generates the 2D images of the $i^{th}$ layer object according to the initial control code file of the $i^{th}$ layer object. The section profile of each layer object can be clearly seen from the 2D images.

Next, the processor 110 determines whether a coverage of a 2D image of a $(i+1)^{th}$ layer object is equal to a coverage of the 2D image of the $i^{th}$ layer object (Step S404). That is to say, the processor 110 determines whether two layer objects that are adjacent to each other vertically have the same section profile. If it is determined affirmative in Step S404, the processor 110 adds the thickness of the $(i+1)^{th}$ layer object to the current cumulative thickness to generate a combined thickness (Step S405). Thereafter, the processor 110 determines whether a $(i+2)^{th}$ layer object exists (Step S406). If it is determined affirmative in Step S406, the processor 110 moves on to the next layer object to make determination (setting i=i+1) (Step S407) and repeats Step S404. It is known from the above that layer objects that are adjacent to each other and have the same section profile are stacked to form the stack object. The thickness of the stack object is determined by the times of stacking.

On the other hand, if it is determined negative in Step S404, it indicates that the coverage of the 2D image of the $(i+1)^{th}$ layer object is not equal to the coverage of the 2D image of the $i^{th}$ layer object. In other words, the processor 110 determines that the adjacent two layer objects do not have the same section profile. Therefore, the processor 110 adjusts output intensity of the light source according to the combined thickness of the stack object (Step S408). In this embodiment, the thicker the combined thickness of the stack object is, the higher the output intensity of the light source is adjusted, so as to cure the stack object having the combined thickness.

Thereafter, the processor 110 sets the combined control code file (Step S409). It is noted that, because the $(i+1)^{th}$ layer object and the $i^{th}$ layer object have the same section profile, the initial control code file of the $(i+1)^{th}$ layer object and the initial control code file of the $i^{th}$ layer object are the same, and the combined control code file of the current stack object is also the same as the initial control code file of the $i^{th}$ layer object. Accordingly, the processor 110 sets the combined control code file as the initial control code file of the $(i+1)^{th}$ layer object.

After obtaining the combined thickness and the combined control code file of the stack object, the processor 110 controls an irradiation pathway of the light source according to the combined control code file to cure the irradiated liquid molding material 102, so as to form the 3D object on the movable platform 130 (Step S410). In other words, when the processor 110 moves the movable platform 130 to a position on the Z axis according to the combined thickness, the light source 140 irradiates and cures a portion of the liquid molding material 102 according to the adjusted output intensity and the combined control code file of the stack object. Therefore, the movable platform 130 moves along the Z axis, and the liquid molding material 102 is gradually cured along the way to complete the formation of the 3D object 50.

Figure 5A:
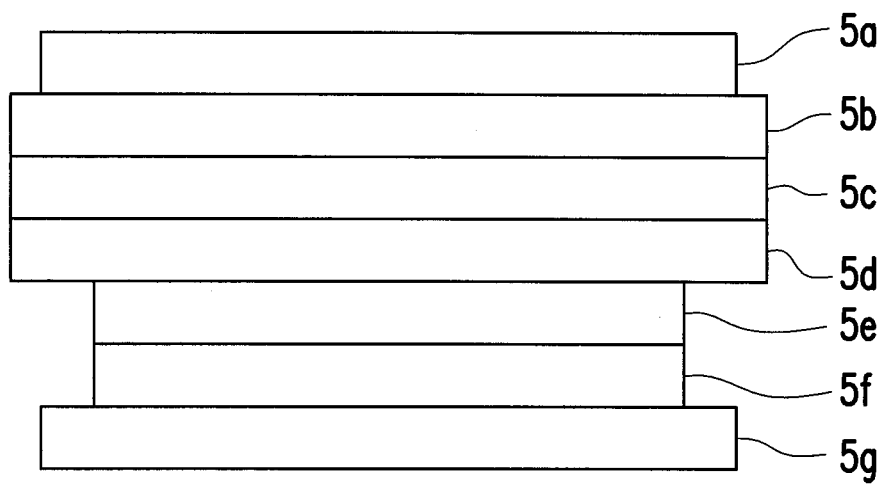
FIG. 5A and FIG. 5B are schematic cross-sectional diagrams illustrating a three-dimensional object according to an exemplary embodiment.
Figure 5B:
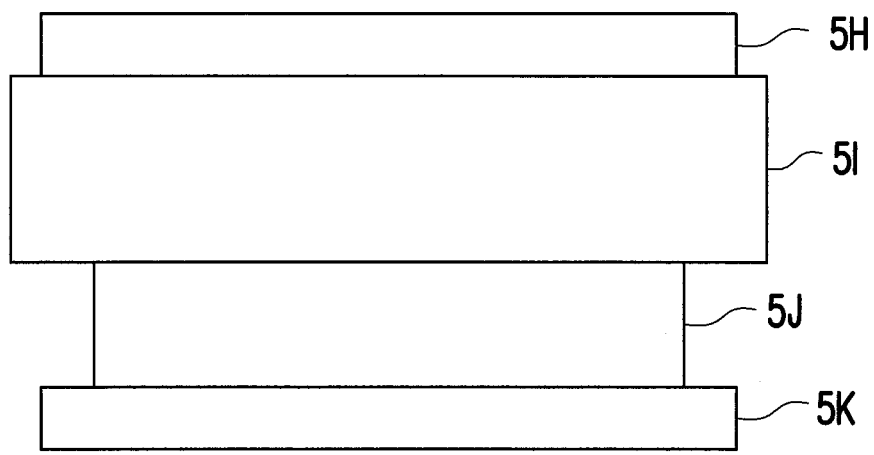

For example, FIG. 5A and FIG. 5B are schematic cross-sectional diagrams illustrating a three-dimensional object according to an exemplary embodiment. With reference to FIG. 5A and FIG. 5B, in this embodiment, a 3D object includes a plurality of layer objects 5a-5g after the slicing process, wherein each of the layer objects 5a-5g has the same standard thickness. As shown in FIG. 5A, it is given that 2D images of the layer objects 5b-5d have the same coverage, and 2D images of the layer objects 5e-5f have the same coverage. Therefore, a stack object 5I is obtained by stacking the layer object 5b, the layer object 5c, and the layer object 5d. The combined thickness of the stack object 5I is three times the standard thickness. A combined control code file of the stack object 5I is the same as the initial control code files of the layer object 5b, the layer object 5c, and the layer object 5d.

Similarly, a stack object 5J is obtained by stacking the layer object 5e and the layer object 5f. The thickness of the stack object 5J is two times the standard thickness. A combined control code file of the stack object 5J is the same as the initial control code files of the layer object 5e and the layer object 5f. A stack object 5H is equivalent to the layer object 5a, and a stack object 5K is equivalent to the layer object 5g.

Based on the above, it is given that a printing direction is a direction of printing from the layer object 5a to the layer object 5g. After the 3D printing apparatus 100 finishes printing the layer object 5a (the stack object 5H), the 3D printing apparatus 100 only needs to increase the output intensity of the light source 140 and move the movable platform 130 once according to the combined thickness of the stack object 5I to generate the stack object 5I by one scan. By contrast to the above, if the stack object 5I is not formed by stacking, the 3D printing apparatus 100 has to move the movable platform 130 three times and perform scanning three times to sequentially generate the layer objects 5b-5d. It is known from the above that, by generating the stack object 5I, the printing speed of the 3D printing apparatus 100 is increased efficiently.

Figure 6:
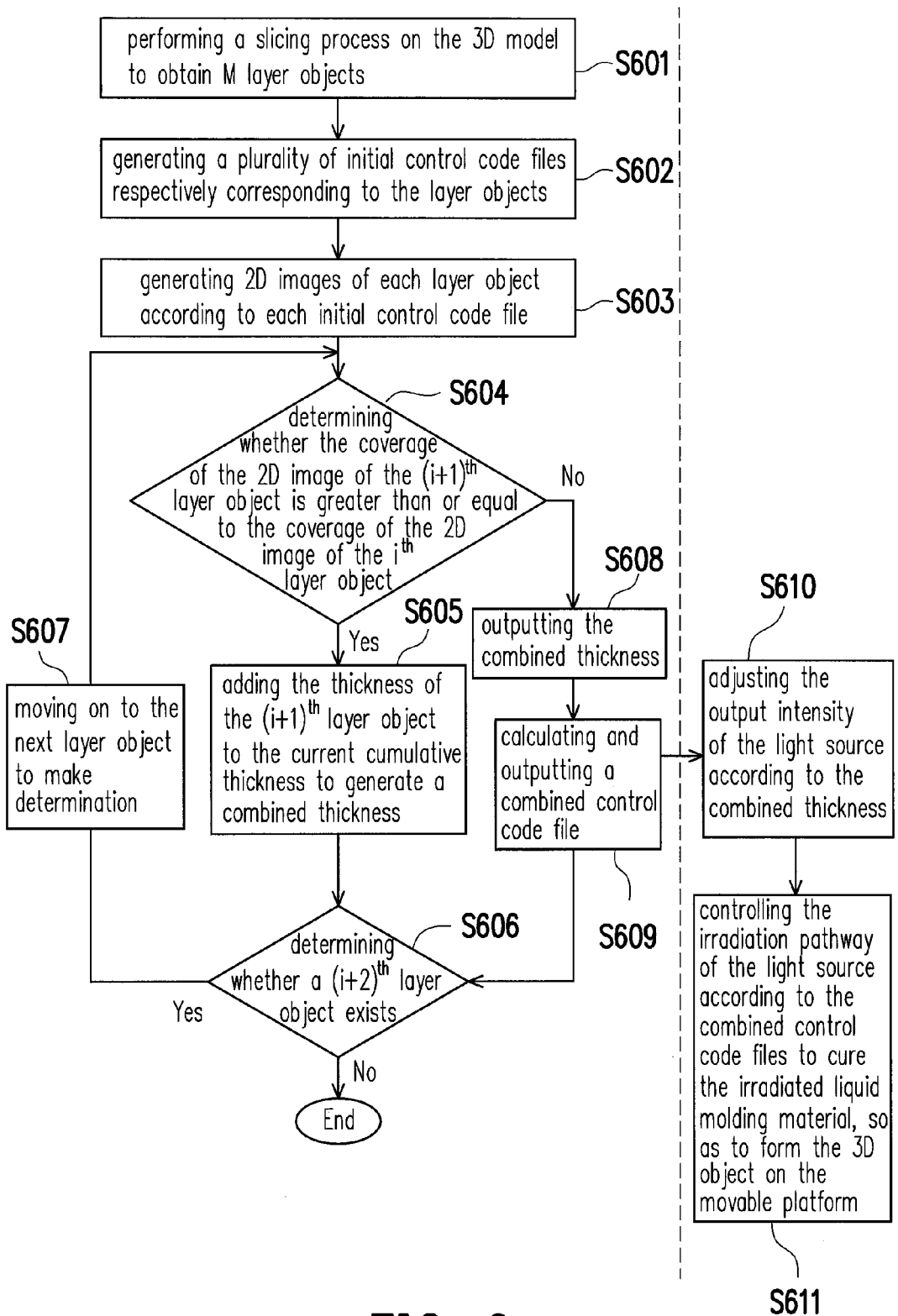
FIG. 6 is a flowchart illustrating a three-dimensional printing method according to an exemplary embodiment.

FIG. 6 is a flowchart illustrating a three-dimensional printing method according to an exemplary embodiment. The method of this embodiment is adapted for the 3D printing system of FIG. 1 and the 3D printing apparatus of FIG. 3. Steps of the 3D printing method of this embodiment are explained in detail hereinafter with reference to the components of the 3D printing system 10 and the 3D printing apparatus 100.

First, the processor 210 generates a 3D model, which may be a model manufactured by the user with use of model editing software or a 3D model obtained by scanning an object using 3D scanning technology. The disclosure is not intended to limit how the 3D model is constructed or obtained. The processor 210 performs a slicing process on the 3D model to obtain M layer objects (Step S601), wherein M is an integer greater than 1. Next, the processor 210 generates a plurality of initial control code files respectively corresponding to the layer objects (Step S602). In other words, the processor 210 generates the initial control code file of an $i^{th}$ layer object in sequence, wherein i is an integer greater than 0 and smaller than or equal to M. Then, the processor 210 generates the 2D images of each of the layer objects according to the initial control code files (Step S603). Steps S601-S603 are similar to Steps S401-S403 of the previous embodiment and are not repeated hereinafter.

A difference between this embodiment and the previous embodiment is that the processor 210 determines whether the coverage of the 2D image of the $(i+1)^{th}$ layer object is greater than or equal to the coverage of the 2D image of the $i^{th}$ layer object (Step S604). More specifically, the processor 210 determines whether the section profile of the next layer object completely covers the section profile of the previous layer object. If it is determined affirmative in Step S604, the processor 210 adds the thickness of the $(i+1)^{th}$ layer object to the current cumulative thickness to generate a combined thickness (Step S605). Thereafter, the processor 210 determines whether a $(i+2)^{th}$ layer object exists (Step S606). If it is determined affirmative in Step S606, the processor 210 moves on to the next layer object to make determination (setting i=i+1) (Step S607) and repeats Step S604. It is known from the above that layer objects that are adjacent to each other and have coverages in an ascending order can be combined to form a stack object. Therefore, different from the previous embodiment, the stack object of this embodiment has a plurality of combined thicknesses, and the combined thicknesses of this stack object are determined by the times of stacking and the section profile of each layer object.

On the other hand, if it is determined negative in Step S604, it indicates that the coverage of the 2D image of the $(i+1)^{th}$ layer object is smaller than the coverage of the 2D image of the $i^{th}$ layer object. That is to say, the processor 110 determines that the section coverage of the next layer object is smaller than the section coverage of the previous layer object. Therefore, the processor 210 outputs a plurality of combined thicknesses of the stack object (Step S608). Moreover, the processor 210 further calculates and outputs a combined control code file of the stack object (Step S609). Specifically, the processor 210 obtains a plurality of combined control code files of the stack object by comparing the coverages of the layer objects.

Take the first layer object and the second layer object that are adjacent to each other as an example, if the coverage of the second layer object is larger than the coverage of the first layer object, the processor 210 adds the thickness of the first layer object to the thickness of the second layer object to generate a first combined thickness and records the thickness of the second layer object as a second combined thickness. Next, the processor 210 compares the coverage of the first layer object with the coverage of the second layer object to generate a first combined control code file associated with the first combined thickness and a second combined control code file associated with the second combined thickness. That is, in this embodiment, one single stack object may have a plurality of combined thicknesses, which respectively correspond to different combined control code files. In other words, in one single stack object, the section profiles, which are corresponding to different combined control code files, of the stack object and have different combined thicknesses.

Accordingly, after the processor 110 of the 3D printing apparatus 100 receives the combined thicknesses and the combined control code files, the processor 110 adjusts the output intensity of the light source according to the combined thicknesses (Step S610). The processor 110 controls the irradiation pathway of the light source according to the combined control code files to cure the irradiated liquid molding material 102, so as to form the 3D object on the movable platform 130 (Step S611). More specifically, when the processor 110 moves the movable platform 130 to a position on the Z axis according to the thickest one of the combined thicknesses, the light source 140 adjusts the output intensity according to different combined thicknesses and irradiates and cures a portion of the liquid molding material 102 according to the current adjusted output intensity and the corresponding combined control code files.

Figure 7A:
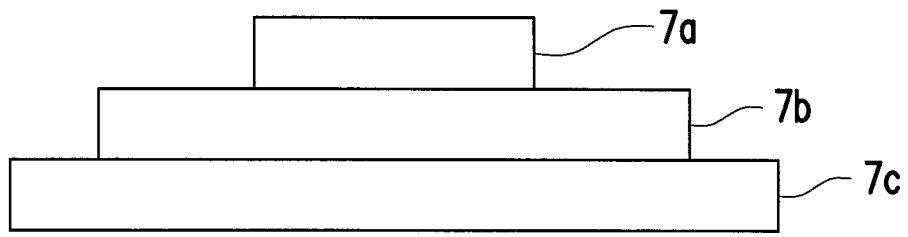
FIG. 7A and FIG. 7B are schematic cross-sectional diagrams illustrating a three-dimensional object according to an exemplary embodiment.
Figure 7B:
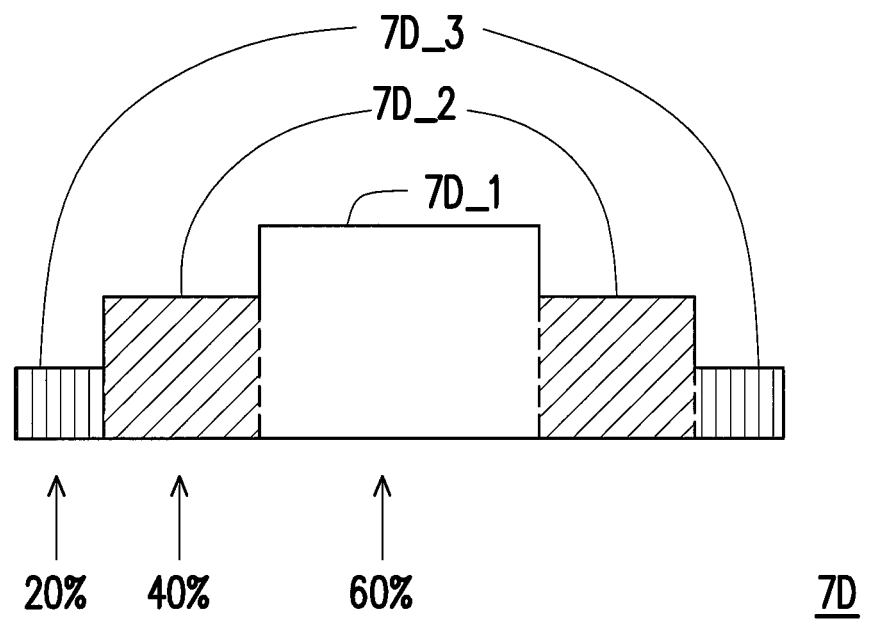
Figure 7C:
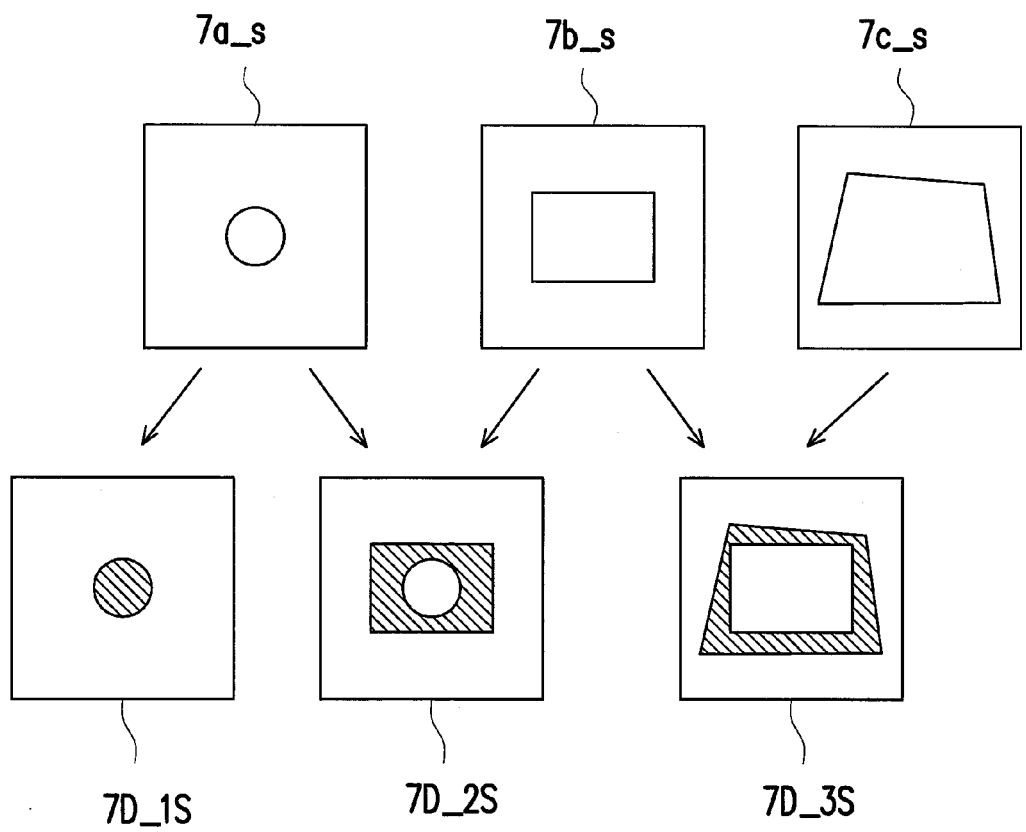
FIG. 7C is a schematic diagram illustrating obtaining a combined control code file according to an exemplary embodiment.

FIG. 7A and FIG. 7B are schematic cross-sectional diagrams illustrating a three-dimensional object according to an exemplary embodiment. FIG. 7C is a schematic diagram illustrating obtaining a combined control code file according to an exemplary embodiment.

With reference to FIG. 7A and FIG. 7B, in this embodiment, a 3D object includes a plurality of layer objects 7a-7c after the slicing process, wherein each of the layer objects 7a-7c has the same standard thickness. In this embodiment, it is given that the maximum thickness that the light source 140 can cure is five times the standard thickness. That is, if the output intensity of the light source 140 is 100%, the thickness that can be cured is five times the standard thickness. If the output intensity of the light source 140 is 60%, the thickness that can be cured is three times the standard thickness, and so forth.

As shown in FIG. 7A and FIG. 7B, it is given that the section coverages of the layer objects 7a-7c are in an ascending order. Therefore, a stack object 7D is obtained by stacking the layer object 7a, the layer object 7b, and the layer object 7c. In this embodiment, because the layer object 7a, the layer object 7b, and the layer object 7c have different coverages, the stack object 7D has three combined thicknesses. As shown in FIG. 7B, the stack object 7D is divided into a portion 7D_1, a portion 7D_2, and a portion 7D_3. The combined thickness of the portion 7D_1 is three times the standard thickness, the combined thickness of the portion 7D_2 is two times the standard thickness, and the combined thickness of the portion 7D_3 is equal to the standard thickness.

Further referring to FIG. 7C, the layer object 7a has a coverage 7a_s corresponding to the slice plane, the layer object 7b has a coverage 7b_s corresponding to the slice plane, and the layer object 7c has a coverage 7c_s corresponding to the slice plane. It is known from the above that an overlap portion of the layer object 7a, the layer object 7b, and the layer object 7c is an overlap coverage 7D_1s. An overlap portion of the layer object 7b and the layer object 7c is an overlap coverage 7D_2s. A portion of the layer object 7c which does not overlap the layer object 7a and the layer object 7b is an overlap coverage 7D_3s.

Accordingly, the combined thickness corresponding to the overlap coverage 7D_1s is three times the standard thickness. The combined thickness corresponding to the overlap coverage 7D_2s is two times the standard thickness. The combined thickness corresponding to the overlap coverage 7D_3s is equal to the standard thickness. That is to say, the section coverage of the portion 7D_1 corresponding to the slice plane is the coverage 7D_1s, the section coverage of the portion 7D_2 corresponding to the slice plane is the coverage 7D_2s, and the section coverage of the portion 7D_3 corresponding to the slice plane is the coverage 7D_3s. Thus, combined control code files corresponding to different combined thicknesses are generated based on the coverages 7D_1s, 7D_2s, and 7D_3s.

Accordingly, it is given that the printing direction is a direction of printing from the layer object 7a to the layer object 7c. It is known from the above that the 3D printing apparatus 100 only needs to move the movable platform 130 one time to generate the stack object 7D. Furthermore, the 3D printing apparatus 100 adjusts the output intensity of the light source 140 to 60% according to the combined thickness of the portion 7D_1 and generates the portion 7D_1 of the stack object 7D on the movable platform 130 according to the combined control code file corresponding to the portion 7D_1. Then, the 3D printing apparatus 100 adjusts the output intensity of the light source 140 to 40% according to the combined thickness of the portion 7D_2 and generates the portion 7D_2 of the stack object 7D on the movable platform 130 according to the combined control code file corresponding to the portion 7D_2. At last, the 3D printing apparatus 100 adjusts the output intensity of the light source 140 to 20% according to the combined thickness of the portion 7D_3 and generates the portion 7D_3 of the stack object 7D on the movable platform 130 according to the combined control code file corresponding to the portion 7D_3. Based on the above, by generating the stack object 7D, the printing speed of the 3D printing apparatus 100 is increased efficiently.

To sum up, in the above embodiments of the disclosure, multiple layer objects that match the stack condition are stacked to generate the stack object having the cumulative thickness. Accordingly, the 3D printing apparatus adjusts the output intensity of the light source according to the cumulative thickness of the stack object and controls the irradiation pathway according to the combined control code file. Compared with a 3D printing method of printing uniform layer thickness, the embodiments of the disclosure utilize the stack object to reduce the times of moving the movable platform and the times of scanning of the light source, thereby significantly improving the printing efficiency of the 3D printing apparatus.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A three-dimensional printing method, adapted for printing a three-dimensional object, the three-dimensional printing method comprising:

obtaining a plurality of layer objects of a three-dimensional model by performing a slicing process on the three-dimensional model and generating a plurality of two-dimensional images, corresponding to a slice plane, of each of the layer objects, wherein the layer objects comprise a first layer object and a second layer object adjacent to each other;

stacking the first layer object and the second layer object to generate thickness stack information of a stack object when a comparison relationship between the two-dimensional image of the first layer object and the two-dimensional image of the second layer object matches a stack condition; and initiating a printing mechanism according to the thickness stack information to print the three-dimensional object associated with the three-dimensional model, wherein the step of stacking the first layer object and the second layer object to generate the thickness stack information of the stack object when the comparison relationship between the two-dimensional image of the first layer object and the two-dimensional image of the second layer object matches the stack condition comprises:
  after obtaining the first layer object and the second layer object by performing the slicing process, determining whether a coverage of the two-dimensional image of the second layer object is larger than or equal to a coverage of the two-dimensional image of the first layer object; and
  after obtaining the first layer object and the second layer object by performing the slicing process, stacking the first layer object and the second layer object to generate at least one combined thickness and at least one combined control code file of the stack object only when the coverage of the two-dimensional image of the second layer object is larger than or equal to the coverage of the two-dimensional image of the first layer object,
  wherein the step of initiating the printing mechanism according to the thickness stack information to print the three-dimensional object associated with the three-dimensional model comprises:
  adjusting irradiation intensity of a light source into a first value according to the at least one combined thickness; and
  adjusting the irradiation intensity of the light source into a second value according to the at least one combined thickness and generating the stack object to have multiple thicknesses on a movable platform while moving the movable platform only once.

2. The three-dimensional printing method according to claim 1, wherein the step of obtaining the layer objects of the three-dimensional model and generating the two-dimensional images, corresponding to the slice plane, of each of the layer objects comprises:
  generating a plurality of initial control code files respectively corresponding to the layer objects; and
  generating the two-dimensional images of each of the layer objects according to the initial control code files.

3. The three-dimensional printing method according to claim 2, wherein the initial control code files are G code files.

4. The three-dimensional printing method according to claim 1, wherein the step of stacking the first layer object and the second layer object to generate the at least one combined thickness and the at least one combined control code file of the stack object when the coverage of the two-dimensional image of the second layer object is larger than or equal to the coverage of the two-dimensional image of the first layer object comprises:
  determining whether the coverage of the two-dimensional image of the second layer object is equal to the coverage of the two-dimensional image of the first layer object; and
  if affirmative, adding a thickness of the first layer object and a thickness of the second layer object to generate the at least one combined thickness.

5. The three-dimensional printing method according to claim 4, further comprising:
  setting the at least one combined control code file as an initial control code file of the second layer object, wherein the initial control code file of the second layer object is the same as an initial control code file of the first layer object.

6. The three-dimensional printing method according to claim 1, wherein the step of stacking the first layer object and the second layer object to generate the at least one combined thickness and the at least one combined control code file of the stack object when the coverage of the two-dimensional image of the second layer object is larger than or equal to the coverage of the two-dimensional image of the first layer object comprises:
  determining whether the coverage of the two-dimensional image of the second layer object is larger than the coverage of the two-dimensional image of the first layer object; and
  if affirmative, adding the thickness of the first layer object and the thickness of the second layer object to generate a first combined thickness of the at least one combined thickness and recording the thickness of the second layer object as a second combined thickness of the at least one combined thickness.

7. The three-dimensional printing method according to claim 6, further comprising:
  comparing the coverage of the first layer object with the coverage of the second layer object to generate a first combined control code file associated with the first combined thickness and a second combined control code file associated with the second combined thickness.

8. The three-dimensional printing method according to claim 1, wherein the step of initiating the printing mechanism according to the thickness stack information to print the three-dimensional object associated with the three-dimensional model comprises:
  adjusting output intensity of the light source according to the at least one combined thickness; and
  controlling an irradiation pathway of the light source according to the at least one combined control code file to cure an irradiated liquid molding material, so as to form the three-dimensional object on the movable platform.

9. The three-dimensional printing method according to claim 1, wherein the printing mechanism is a stereolithography (SLA) printing mechanism.

10. A three-dimensional printing apparatus, comprising:
  a processor obtaining a plurality of layer objects of a three-dimensional model based on a slicing process performed on the three-dimensional model and generating a plurality of two-dimensional images, corresponding to a slice plane, of each of the layer objects, wherein the layer objects comprise a first layer object and a second layer object adjacent to each other, and the processor stacks the first layer object and the second layer object to generate thickness stack information of a stack object when a comparison relationship between the two-dimensional image of the first layer object and the two-dimensional image of the second layer object matches a stack condition,
  wherein the processor initiates a printing mechanism according to the thickness stack information to print a three-dimensional object associated with the three-dimensional model,
  wherein after obtaining the first layer object and the second layer object based on the slicing process, the processor determines whether a coverage of the two-dimensional image of the second layer object is larger than or equal to a coverage of the two-dimensional image of the first layer object,
  wherein after obtaining the first layer object and the second layer object based on the slicing process, the processor stacks the first layer object and the second layer object to generate at least one combined thickness and at least one combined control code file of the stack object only when the coverage of the two-dimensional image of the second layer object is larger than or equal to the coverage of the two-dimensional image of the first layer object, wherein the processor adjusts irradiation intensity of a light source into a first value according to the at least one combined thickness adjusts the irradiation intensity of the light source into a second value according to the at least one combined thickness, and controls the printing mechanism to generate the stack object to have multiple thicknesses on a movable platform according to the combined control code file while moving the movable platform only once.

11. The three-dimensional printing apparatus according to claim 10, wherein the processor obtains a plurality of initial control code files respectively corresponding to the layer objects from an electronic apparatus and generates the two-dimensional images of each of the layer objects according to the initial control code files.

12. The three-dimensional printing apparatus according to claim 10, wherein the processor determines whether the coverage of the two-dimensional image of the second layer object is equal to the coverage of the two-dimensional image of the first layer object; and if affirmative, the processor adds a thickness of the first layer object and a thickness of the second layer object to generate the at least one combined thickness.

13. The three-dimensional printing apparatus according to claim 12, wherein the processor sets the at least one combined control code file as an initial control code file of the second layer object, wherein the initial control code file of the second layer object is the same as an initial control code file of the first layer object.

14. The three-dimensional printing apparatus according to claim 10, wherein the processor determines whether the coverage of the two-dimensional image of the second layer object is larger than or equal to the coverage of the two-dimensional image of the first layer object; and if affirmative, the processor adds the thickness of the first layer object and the thickness of the second layer object to generate a first combined thickness of the at least one combined thickness and records the thickness of the second layer object as a second combined thickness of the at least one combined thickness.

15. The three-dimensional printing apparatus according to claim 14, wherein the processor compares the coverage of the first layer object with the coverage of the second layer object to generate a first combined control code file associated with the first combined thickness and a second combined control code file associated with the second combined thickness.

16. The three-dimensional printing apparatus according to claim 10, further comprising:
a container adapted for containing a liquid molding material;
the movable platform disposed movably above the container; and
the light source disposed under the container for irradiating the liquid molding material,
wherein the processor adjusts output intensity of the light source according to the at least one combined thickness and controls an irradiation pathway of the light source according to the at least one combined control code file to cure the irradiated liquid molding material and form the three-dimensional object on the movable platform.

17. An electronic apparatus, comprising:
a processor obtaining a plurality of layer objects of a three-dimensional model by performing a slicing process on the three-dimensional model and generating a plurality of two-dimensional images, corresponding to a slice plane, of each of the layer objects, wherein the layer objects comprise a first layer object and a second layer object adjacent to each other, and the processor stacks the first layer object and the second layer object to generate thickness stack information of a stack object when a comparison relationship between the two-dimensional image of the first layer object and the two-dimensional image of the second layer object matches a stack condition,
wherein the processor controls a three-dimensional printing apparatus to initiate a printing mechanism according to the thickness stack information to print a three-dimensional object associated with the three-dimensional model,
wherein after obtaining the first layer object and the second layer object by performing the slicing process, the processor determines whether a coverage of the two-dimensional image of the second layer object is larger than or equal to a coverage of the two-dimensional image of the first layer object,
wherein after obtaining e first layer object and the second layer object by performing the slicing process, the processor stacks the first layer object and the second layer object to generate at least one combined thickness and at least one combined control code file of the stack object only when the coverage of the two-dimensional image of the second layer object is larger than or equal to the coverage of the two-dimensional image of the first layer object,
wherein the processor adjusts irradiation intensity of a light source into a first value according to the at least one combined thickness, adjusts the irradiation intensity of the light source into a second value according to the at least one combined thickness, and controls the printing mechanism to generate the stack object to have multiple thicknesses on a movable platform while moving the movable platform only once.

18. The electronic apparatus according to claim 17, wherein the processor generates a plurality of initial control code files respectively corresponding to the layer objects and generates the two-dimensional images of each of the layer objects according to the initial control code files.

* * * * *